United States Patent [19]

Jove et al.

[11] Patent Number: 5,103,353
[45] Date of Patent: * Apr. 7, 1992

[54] LOW NOISE AMPLIFIER WITH SHORT CIRCUIT PROTECTION FOR SIGNALS FROM MAGNETORESISTIVE ELEMENT

[75] Inventors: Stephen A. Jove, Watsonville; Klaas B. Klaassen, San Jose; Calvin S. Nomura, San Jose; Jacobus C. Leonardus van Peppen, San Jose, all of Calif.

[73] Assignee: International Business Machines Corporation, Armonk, N.Y.

[*] Notice: The portion of the term of this patent subsequent to Nov. 7, 2006 has been disclaimed.

[21] Appl. No.: 517,093

[22] Filed: May 1, 1990

[51] Int. Cl.$^5$ ............................ G11B 5/02; G11B 5/127
[52] U.S. Cl. .......................................... 360/67; 360/113
[58] Field of Search ........................ 360/67, 68, 46, 113; 330/60; 324/252

[56] References Cited

U.S. PATENT DOCUMENTS 4,706,138 11/1987 Jove et al. .......................... 360/67
4,743,861  5/1988 Jove et al. .......................... 360/260
4,750,058  6/1988 Hirt et al. .......................... 360/46
4,879,610 11/1989 Jove et al. .......................... 360/67

FOREIGN PATENT DOCUMENTS 0241770 10/1987 European Pat. Off. .
0251023  1/1988 European Pat. Off. .
3435867  4/1986 Fed. Rep. of Germany .

Primary Examiner—Aristotelis Psitos
Assistant Examiner—Won Tae C. Kim
Attorney, Agent, or Firm—Henry E. Otto, Jr.

[57] ABSTRACT

An amplifier circuit is disclosed for simultaneously producing electrical output signals whose magnitude is representative of signals produced by a magnetoresistive (MR) element and protecting said MR element from electrical short circuits between said element and its environment. A means including a first feedback loop biases the MR element with a bias current and amplifies a signal current for causing the MR element to produce a circuit output signal corresponding to dRh/Rh and in which any dc offset error is minimized. Rh is the resistance of the MR element and dRh is the magnetic-signal-induced change in the resistance of the MR element. A second feedback loop insures that the MR element is held at a preselected reference potential and concurrently insures that no current will flow sufficient to damage the element in event of a short circuit between the element and its environment. The feedback loops are interconnected by outputs of the respective feedback loops being commonly connected to the bases of a pair of input bipolar transistors, whose respective emitters are connected to opposite terminals of the MR element.

18 Claims, 3 Drawing Sheets

LOW NOISE AMPLIFIER WITH SHORT CIRCUIT PROTECTION FOR SIGNALS FROM MAGNETORESISTIVE ELEMENT

This invention relates to circuits for amplifying signals produced by a magnetoresistive (MR) element, and more particularly to such a circuit which has low noise and yet protects the MR element from large undesirable currents resultant from electrical short circuits between the MR element and its surrounding environment, such as a magnetic recording disk.

BACKGROUND OF THE INVENTION

MR elements or heads can read data from a magnetic surface at high linear densities. An MR head detects magnetic field signals through resistance changes which are a function of the magnitude and direction of the magnetic flux sensed by the head.

U.S. Pat. No. 4,706,138 discloses a current biased, current sensing amplifier that biases and amplifies the signals produced by an MR element. The amplifier senses a current signal derived from the MR element which corresponds to dRh/Rh, where Rh is the resistance of the MR element and dRh is the magnetic-signal-induced change or delta in MR element resistance. This amplifier provides no short circuit protection and does not include means to maintain the MR element at a prescribed voltage (e.g., with reference to ground). It also employs so-called "bang-bang" feedback control and inputs a fixed signal approximating minimum offset error instead of changing the gain and linear response of the feedback loop.

U.S. Pat. No. 4,879,610 discloses an amplifier for biasing and amplifying the signals produced by an MR element. The amplifier amplifies a current signal derived from the MR element which corresponds solely to dRh, where dRh (as in U.S. Pat. No. 4,706,138) is the magnetic-signal-induced change in MR element resistance. This amplifier provides short circuit protection and is very suitable for use in applications involving high data rates provided the signal amplitude is relatively large. However, this amplifier provides an output with a relatively low signal-to-noise ratio. Signal-to-noise ratio becomes an increasingly serious problem in view of the trend in magnetic recording to continually increase track density and reduce signal amplitude.

U.S. Pat. No. 4,743,861 discloses a frequency compensation circuit for always increasing high frequency bandwidth when data rate is high, and under certain circumstances, such as in the circuit herein disclosed, when input lead inductance is high and input loop resistance is low.

None of these references or any other prior art known to applicants provides both short circuit protection and low noise. There is a need for a circuit that has (a) low noise to enable use in applications involving low amplitude input signals, (b) provides short circuit protection between the MR element and its environment, and (c) also varies the gain and frequency response of a feedback loop to enable faster switching between a plurality of MR elements.

SUMMARY OF THE INVENTION

An amplifier circuit is disclosed for simultaneously producing electrical output signals whose magnitude is representative of signals produced by a magnetoresistive (MR) element and protecting said MR element from electrical short circuits between said element and its environment. A means including a first feedback circuit loop biases the MR element with a bias current and amplifies a signal current for causing the MR element to produce a circuit output signal corresponding to dRh/Rh and in which any dc offset error is minimized. A second feedback circuit loop insures that the MR element is held at a preselected reference potential and concurrently insures that no current will flow sufficient to damage the element in event of a short circuit between the element and its environment. The feedback loops are interconnected by outputs of the respective feedback loops being commonly connected to the bases of a pair of input bipolar transistors, whose respective emitters are connected to opposite terminals of the MR element.

Each feedback loop comprises an operational transconductance amplifier (OTA) for converting an error voltage to a control current output. The OTA for the first feedback loop provides a differential control current output for adjusting the potential between the bases of the input transistors to insure that a reference current will be divided equally between each input transistor of the pair for maintaining the MR element biased at a prescribed bias current. The OTA for the second feedback loop provides currents of substantially equal magnitude to the base of each bipolar input transistor of the pair to provide respective emitter currents whose sum is substantially equal to a predetermined reference current.

DESCRIPTION OF PREFERRED EMBODIMENTS

Figure 1:
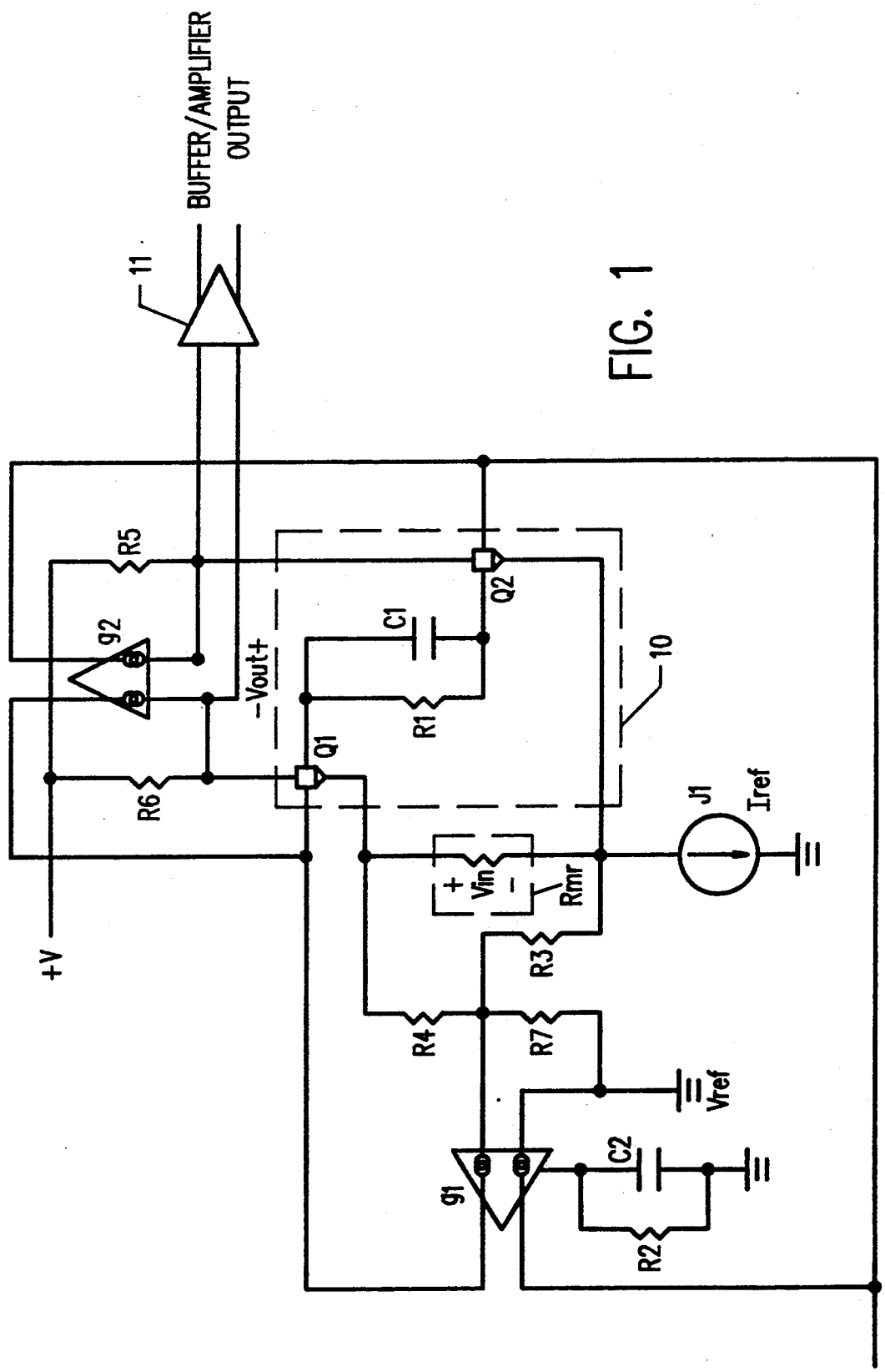
FIG. 1 is a schematic diagram illustrating the basic concept of a circuit embodying the principles of the invention.

As illustrated in simplified form in FIG. 1, the low noise amplifier circuit embodying the invention provides short circuit protection for a magnetoresistive (MR) element Rmr, such as an MR head in a magnetic disk file. Bipolar NPN transistors Q1 and Q2 are the input devices to the amplifier. These transistors, together with a capacitor C1 and a resistor R1 interposed in parallel between said transistors, constitute an input stage 10 to the amplifier circuit. A biasing current Iref is fixed at a value equal to twice the value of current needed to bias MR element Rmr.

According to a feature of the invention, the amplifier circuit has two feedback circuit loops which are interconnected by virtue of their outputs being commonly connected to the respective bases of transistors Q1 and Q2.

One circuit loop is a common mode feedback loop comprising resistors R3, R4 and R7, and an operational transconductance amplifier (OTA) g1 for which a resistor R2 and capacitor C2 in parallel combination determine the dominant time constant of this loop. The purpose of this loop is to control the common mode voltage at the bases of input transistors Q1 and Q2, in such manner that the dc potential at the electrical center of the MR element Rmr will be maintained substantially equal to a reference voltage Vref. Usually, and as illustrated, Vref is made ground.

The other circuit loop is a differential feedback loop comprising an OTA g2, resistors R5, R6 and R1, and a capacitor C1. The purpose of this loop is to insure that the emitter currents through both input devices are equal; that is, equal to Jref/2. Capacitor C1 and resistor R1 are connected in parallel combination to determine the dominant time constant in this other loop.

Assuming an MR element of steady-state resistance Rh is used, and that the bias current Iref/2=Ib, then a bias voltage defined as:

$$Vb = Ib\, Rh \qquad (1)$$

will exist across the MR element, and is constant in value across the frequency band of interest. Resistance Rh is made up of a fixed resistance Rh and dRh, the magnetic-signal-induced change in resistance of the MR element; and the current through Rh is made up of a constant time-average value of bias current I and a variable signal current dI. Taking the derivative with respect to time of both sides of Equation (1) above, the following equation is derived after manipulation:

$$dI = (-I\, dRh)/Rh \qquad (2)$$

If the collector resistors (R5 and R6) of the amplifier in FIG. 1 are defined as Rc, then the expression for Vout becomes $$Vout = (2\, Rc\, I\, dRh)/Rh \qquad (3)$$

which is of the form K dRh/Rh. So, the amplifier produces an output signal corresponding to dRh/Rh.

Figure 2:
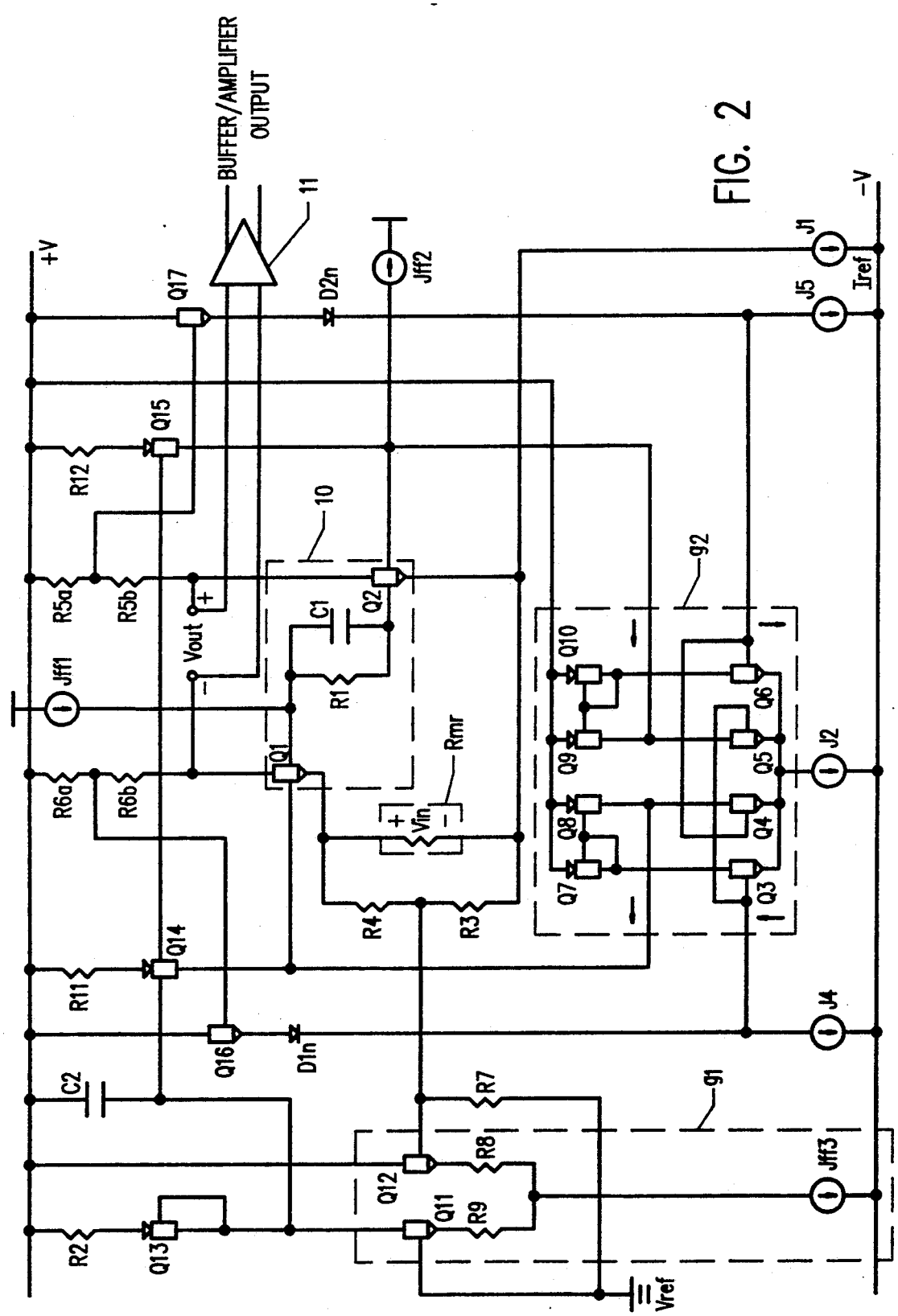
FIG. 2 is a circuit diagram of a preferred embodiment of low noise amplifier circuit embodying the invention.

In FIG. 2, which depicts in more detail an amplifier circuit according to a preferred embodiment of the invention, similar reference characters are used to identify similar components. OTA g1 comprises a current source Jff3, transistors Q12 and Q11 and resistors R8 and R9. OTA g1 produces a current proportional to the difference in potential between Vref (ground, as illustrated) and the electrical center of the MR element Rmr at the junction of resistors R4, R3 and R7. At the collector of transistor Q11, this differential current is converted to a control reference voltage across capacitor C2. Diode Q13 is preferably provided for temperature stability. As in FIG. 1, capacitor C2 in parallel with resistor R2 primarily determines the dominant time constant in this loop, and also effectively eliminates noise at the output of OTA g1.

The control reference voltage generated across capacitor C2 is converted to two currents of equal magnitude by the transistor/resistor pairs Q14,R11 and Q15,R12. These equal magnitude currents are the base currents needed by the two input transistors Q1 and Q2. These base currents, when multiplied by the current gain of the input transistors Q1 and Q2, result in the respective emitter currents needed in said transistors to satisfy the requirements of current source J1. When the sum of these emitter currents is equal to the bias current Iref, as provided by source J1, and this requirement is thus satisfied, no current will flow to Vref (ground, as illustrated) through resistor R7 and the voltage at the electrical center of the MR element Rmr will be at substantially the potential of Vref (ground, as illustrated).

The other feedback loop is necessary to insure that in addition to having the electrical center of MR element Rmr at a preselected potential, the dc offset at Vout is small. This is necessary because a large dc voltage will exist at Vin due to the effect of the large dc bias current through MR element Rmr. This large dc voltage is not desirable at Vout because it contains no information. Only the small ac signal at Vin is desired to be amplified at Vout as a data signal for later detection.

For this reason, this other loop, which is a differential feedback loop, is connected between Vout and the bases of the input transistors Q1 and Q2. First, the signal at Vout is level shifted via emitter followers Q16 and Q17 and level shifting series diodes D1n and D2n; each n denoting a plurality of diodes in series. Biasing for these level shifters is supplied by current sources J4 and J5.

The Vout terminals of the amplifier circuit are preferably connected to input terminals of a buffer/amplifier 11 to buffer and further amplify the circuit output signal from Vout in order to increase the bandwidth and level of said output signal, respectively, at the buffer/amplifier output.

OTA g2 comprises transistors Q3, Q4, Q5, Q6, Q7, Q8, Q9 and Q10, and current source J2. OTA g2 converts the voltage at Vout 15 to a current between the two outputs of the OTA, thereby creating a voltage drop across resistor R1 to control the dc voltage at Vout substantially at zero. If the loop gain is high, the dc voltage across resistor R1 will equal the voltage across MR element Rmr. Both input transistors Q1 and Q2 will then have equal biasing current (i.e., R5a,b=-R6a,b), so that MR element Rmr will have one half the value of J1 as a bias current. Capacitor C1 across resistor R1 creates the dominant zero in this differential feedback loop, and when modified by the loop gain, creates a dominant pole in the forward transfer function from Vin to Vout.

According to a feature of the invention, by inserting capacitor C1 between the bases of the input transistors Q1 and Q2, differential noise in the loop is eliminated.

According to other features of the invention, differential feedforward currents Jff1 and Jff2 are assumed to be substantially equal. They are applied to the bases of transistors Q1 and Q2, respectively, and develop a voltage across resistor R1 which is substantially equal to the statistically nominal voltage needed across MR element Rmr to minimize the dc offset at Vout and insure that the correct bias current Iref is applied through said MR element. Also, a common-mode third feedforward current Jff3 is applied between resistors R8,R9 and −V. It is adjusted such that the potential at the electrical center of MR element Rmr will be precisely equal to Vref under statistically nominal conditions.

The term "statistically nominal conditions" is intended to connote that the process parameters of all transistors and resistors are at their mean values, and the term "statically nominal voltage" signifies the voltage developed across an MR element of mean resistance when a mean bias current Iref is applied through said element.

According to a feature of the invention, the noise of applicants' amplifier is low compared to amplifiers heretofore disclosed to provide short circuit protection for signals from MR elements. The lower noise is achieved by providing only one biasing current source (Iref) for both MR element Rmr and input stage 10. By eliminating additional biasing stages or reference resistors, noise desirably is reduced in the order of several dB.

The equations and proofs relating to gain, frequency response and short circuit protection are set forth in the Appendix hereto.

Figure 3:
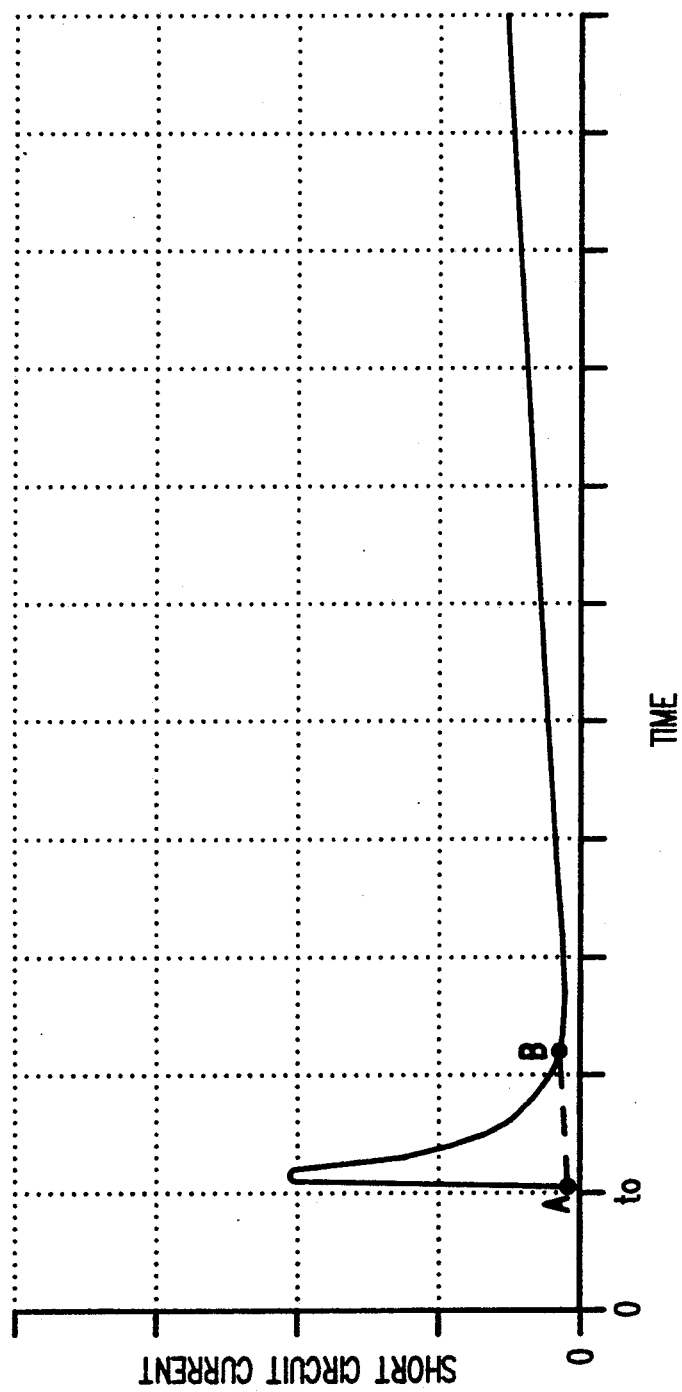
FIG. 3 is a plot of short circuit current vs. time, depicting a short circuit current as a function of circuit topology and input-transistor base parasitic capacitance.

Refer now to FIG. 3 which plots short circuit current vs. time and depicts the effect of such parasitic capacitance C'. Assume that at time t0 a short occurs. Instead of the value of initial short circuit current indicated by Equations (2) or (3) for either Isib or Isit, which is indicated as A, a larger current due to the parasitic capacitance C' occurs. Capacitance C' is to the sum of those parasitic capacitances associated with the base circuit of the input transistors Q1 and Q2. The dashed line A-B indicates what the short circuit profile of the circuit would be without parasitic capacitance. Therefore, the area under the actual short circuit current profile above the dashed line A-B represents the energy approximated in Equation (6); and the total energy dissipated by MR element Rmr is represented by the total area under that profile between the onset and cessation of a short circuit. The short circuit current profile beyond point B is, in the absence of any nonlinear slew rate limitations caused by a the size of capacitor C2 and current Jff3, an exponentially shaped curve with a time constant governed by C2 and its parallel resistance R2 modified by the appropriate gain of what was earlier described as the common mode feedback loop.

The curve depicted in FIG. 3 will increase with time until the final value of short circuit current previously defined in Equation (5) is attained. The time needed from initial to final value of short circuit current is then linearly calculated from the resultant time constant. In the event of slew rate limitation of the common mode feedback loop feedforward current Jff3 and capacitance C2, the time needed from initial to final value of short circuit current is calculated in much the same way as in the above cited U.S. Pat. No. 4,879,610, and will be longer than that value which is linearly calculated.

It will be understood by those skilled in the art that changes in form and detail may be made in the embodiments of amplifier circuit herein described without departing from the scope and teaching of the invention. Accordingly, the low noise amplifier circuit and method herein disclosed are to be considered merely as illustrative, and the invention is to be limited only as specified in the claims.

APPENDIX

Equations and Proofs Relating to Gain, Frequency Response and Short Circuit Protection Assume that transconductance amplifier g2 does not exhibit an output offset current and that feedforward currents Jff1 and Jff2 result, which are substantially equal, in an ideal compensation (that is, $Jff1 \approx \{Rmr \mid\mid (R3+R4)\} J1/2R1$). Under this assumed condition, the voltage Vcm at the center of the MR element Rmr relative to Vref (ground) is given by $$Vcm = \left(Jff3 - \frac{J1R11}{\beta R2}\right)\left(\frac{R8+R9}{2} + 2\frac{Vt}{Jff3}\right) \quad (1)$$

where
Vcm = actual voltage at center of MR head element
$R3 = R4$
$R8 = R9$
$R11 = R12$
$\beta$ = current gain of NPN devices
$Vt = 26$ mV. (the thermal voltage)

The initial short circuit (Isib) from the most negative terminal of MR head element Rmr to ground (Vref) at time $=0+$ is given by $$Isib = \frac{RmrR3}{(Rmr + 2R3)(R3 + R7)} J1. \quad (2)$$

In the event of a short circuit between the most positive terminal of MR head element Rmr and ground (Vref), the current (Isit) through the short circuit is initially $$Isit = -Isib. \quad (3)$$

The short circuit current from the most negative terminal of MR head element Rmr to ground (Vref) will slowly increase to a final value (Isfb) at time $= \infty$, given by $$Isfb = \frac{\beta g'R'Jff3 - \epsilon Jff1}{1 + g'R'} - J1, \quad (4)$$

with $$g' = \frac{1}{1 + 2g2\beta RL} \quad \frac{2\beta}{R1} + \frac{2}{Rmr} + \frac{1}{R3},$$

$$R' = \frac{2R7 + R3}{1 + 2g1\beta R7},$$

$$\epsilon = \frac{2\beta}{1 + 2g2\beta RL},$$

$$g1 = \frac{R2}{R11\left(R8 + R9 + \frac{2Vt}{Jff3}\right)}$$

$$g2 = \frac{J2}{4Vt}$$

$R3 = R4$ and $R5a = R6a = RL.$

If it is assumed $\beta g'R' << 1$, $\epsilon << 1$, and $Isfb \approx -J1$, then the final short circuit current (Isft) from most positive terminal of head element Rmr to ground is given by $$Isft = \frac{\beta g'R'Jff3 + \epsilon Jff1}{1 + g'R'} + \frac{1 - g'R'}{1 + g'R'} J1. \quad (5)$$

As a result of the above assumptions, $Isft \approx J1$.

Acknowledging that parasitic capacitances C' exist between the bases of the bipolar input transistors (like Q1 and Q2) and ground (Vref) or a substrate, such as a magnetic recording disk, the stored charge is nearly instantaneously discharged during a shorting event from MR element Rmr to the environment. The energy dissipated by the MR element Rmr during such an event is approximated by the expression $$E = 0.5 \beta C'V^2 \quad (6)$$

where $V^2$ is the square of the voltage difference between ground (Vref) and the sum of Vcm and one half the bias current (Iref/2) multiplied by the resistance of MR element Rmr.

The transfer function Vout/Vin has a high-pass frequency characteristic with a $-3$ dB frequency given by $$f - 3dB\text{low} = \frac{1 + g2R1\frac{R5a + R6a}{Rmr + 2re}}{2\pi\tau 1}, \quad (7)$$

and a gain in the frequence band of interest of $$G = \frac{R5 + R6}{Rmr + 3re}, \quad (8)$$

where
$R5 = R5a + R5b$,
$R6 = R6a + R6b$,
$T1 = R1C1$,
$g2 = J2/4Vt$, and
$re = 2Vt/J1$.

The high frequency bandwidth of the circuit may be limited by the inductance of the leads from the MR element Rmr to the input devices together with the low input resistance of the amplifier if the input device transition frequency ft is sufficiently high. The expression for the high frequency bandwidth of the amplifier then becomes $$f - 3dB\text{high} = \frac{Ri}{2\pi Li} \quad (9)$$

where
Li = differential series inductance of leads from MR element to amplifier, and
Ri = sum of the resistances in the input loop of the amplifier $$Ri = Rmr + 2re + (2rbb'/\beta)$$

where rbb' is the base spreading resistance associated with each input transistor.

We claim:

1. An amplifier circuit for simultaneously producing electrical output signals whose magnitude is representative of signals produced by a magnetoresistive (MR) element and protecting said MR element from electrical short circuits between said element and its environment, said amplifier circuit comprising:
   means including a first feedback circuit for biasing the MR element with a bias current and amplifying a signal current for causing the MR element to produce a circuit output signal corresponding to dRh/Rh and in which any dc offset error is minimized, where Rh is the resistance of the MR element and dRh is the magnetic-signal-induced change in the resistance of the MR element; and
   a second feedback circuit for insuring that the MR element is held at substantially a preselected reference potential and concurrently insuring that, in event of a short circuit between the MR element and its environment, any current that may flow will not be sufficient to damage the MR element.

2. The circuit of claim 1, further comprising at least one pair of input bipolar transistors, and wherein said feedback circuits are interconnected by outputs of the respective feedback circuits being commonly connected to the bases of each input transistor of a respective pair.

3. The circuit of claim 1, including an MR element having two terminals; and
   at least one pair of bipolar input transistors having their respective emitters connected to opposite terminals of the MR element, for minimizing circuit noise and sensing the signal current.

4. The circuit of claim 1, wherein the degree of short circuit protection increases as the difference between the reference potential and that of the environment decreases, and vice versa.

5. The circuit of claim 1, wherein the degree of short circuit protection increases as the bias current decreases, and vice versa.

6. The circuit of claim 1, wherein each feedback circuit comprises a respective operational transconductance amplifier (OTA) for converting an error voltage to a control current output.

7. The circuit of claim 6, including an MR element and at least one pair of bipolar input transistors, and means providing a predetermined reference current, and wherein the OTA for said first feedback circuit provides a differential control current output for adjusting the potential between the bases of each respective input transistor pair to insure that the reference current will be divided equally between each input transistor pair for maintaining the MR element biased at substantially a prescribed bias current.

8. The circuit of claim 7, wherein the OTA for said second feedback circuit provides currents of substantially equal magnitude to the base of each bipolar input transistor of a pair to provide respective emitter currents whose sum is substantially equal to the predetermined reference current.

9. The circuit of claim 1, including at least one pair of bipolar input transistors, and wherein said first feedback circuit impedance is derived from a resistor (R1) and capacitor (C1) interposed in parallel between the input transistors of each pair for determining the low frequency response of the amplifier circuit, and wherein the amplifier circuit has a dominant zero frequency below a dominant pole frequency to provide a high pass characteristic.

10. The circuit of claim 9, wherein said capacitor shunts noise generated by said resistor.

11. The circuit of claim 1, wherein said second feedback circuit comprises a resistor (R2) and capacitor (C2) in parallel to delay response of said second feedback circuit throughout the duration of a short circuit.

12. The circuit of claim 1, including
    means to buffer and further amplify said amplifier circuit output signal to increase the bandwidth and level of said amplifier circuit output signal, respectively.

13. The circuit of claim 1, including
    means providing substantially equal differential feedforward currents (Jff1, Jff2) to minimize dc offset in said amplifier circuit output signal and insure that said bias current as applied through said element is of correct magnitude.

14. The circuit of claim 1, including an MR element;
    at least one pair of bipolar input transistors;
    a respective operational transconductance amplifier (OTA) forming part of each feedback circuit for converting an error voltage to a control current output; and
    means providing substantially equal differential feedforward currents (Jff1, Jff2) to minimize dc offset in said amplifier circuit output signal and insure that said bias current as applied through said element is of correct magnitude;
    said first feedback circuit comprising an impedance derived from a resistor (R1) and capacitor (C1)

interposed in parallel between the input transistors of each pair for determining the low frequency response of the amplifier circuit, and said amplifier circuit having a dominant zero frequency below a dominant pole frequency to provide a high pass characteristic, said capacitor serving to shunt noise generated by said resistor by the OTAs of both said feedback circuits, and by said feedforward currents (Jff1 and Jff2).

15. The circuit of claim 1, including
means providing a common-mode feedforward current (Jff3); and
means for adjusting said feedforward current to maintain the potential at the electrical center of said MR element precisely equal to said preselected reference potential under statistically nominal conditions.

16. An amplifier circuit for simultaneously producing electrical output signals whose magnitude is representative of signals produced by a magnetoresistive (MR) element and protecting said MR element from electrical short circuits between said element and its environment, said amplifier circuit comprising:
and MR element;
means including a first feedback circuit for biasing the MR element with a bias current and amplifying a signal current for causing the MR element to produce an amplifier circuit output signal corresponding to dRh/Rh and in which any dc offset error is minimized, where Rh is the resistance of the MR element and dRh is the magnetic-signal-induced change in the resistance of the MR element; and
a second feedback circuit for insuring that the MR element is held substantially at a preselected reference potential and concurrently insuring that, in event of a short circuit between the MR element and its environment, any current that may flow will not be sufficient to damage the MR element.

17. An amplifier circuit for simultaneously producing electrical output signals whose magnitude is representative of signals produced by a magnetoresistive (MR) element and protecting said MR element from electrical short circuits between said element and its environment, said amplifier circuit comprising:
and MR element having a first and a second terminal;
a current source coupled to said first terminal for producing a bias current through said MR element;
an input stage having at least one pair of bipolar transistors and also having two output terminals, both said terminals of said MR element being coupled to the emitters of said transistors of each pair for amplifying current deviations from the bias current flowing through said MR element;
first feedback circuit means coupled to the collectors of said transistors of each pair to sense the potential between said output terminals of said input stage to produce a control signal, said control signal being coupled to the bases of said transistors of each pair to substantially eliminate any offset potential between said output terminals;
circuit means coupled across said terminals of said MR element for sensing the center potential of said element substantially midway between said terminals;
means providing a predetermined reference potential;
second feedback circuit means responsive to the difference between the sensed center potential of said MR element and said predetermined reference potential to produce a control signal; and
means responsive to said control signal to apply a bias signal to the bases of said transistors to maintain said center potential of said MR element substantially at said predetermined reference potential, while concurrently insuring that substantially no current will flow through any accidental short circuit between any point along said MR element and its environment.

18. A method of producing electrical output signals whose magnitude is representative of signals produced by a magnetoresistive (MR) element while concurrently protecting the MR element from electrical short circuits between the element and its environment, said method comprising the steps of:
coupling a current source to one of two terminals of a MR element for producing a bias current through the MR element;
providing an input stage having at least two bipolar transistors and output terminals;
coupling both terminals of said MR element to emitters of said transistors for amplifying current deviations from said bias current;
coupling a first feedback circuit means to collectors of said transistors to sense the potential between said output terminals to produce a differential control signal, and coupling said differential control signal to bases of said transistors to substantially eliminate offset potential between said output terminals;
coupling other circuit means across both terminals of said MR element for sensing the center potential of said MR element substantially midway between said both terminals;
using a second feedback circuit means, producing two substantially similar control signals in response to the difference between the sensed center potential of the MR element and a predetermined reference potential; and
in response to said two similar control signals, applying bias signals to the bases of said transistors to maintain said sensed center potential substantially at said predetermined reference potential and concurrently insure that substantially no current will flow through any accidental short circuit between any point along said MR element and its said environment.

* * * * *